(12) United States Patent
Li et al.

(10) Patent No.: US 9,513,350 B2
(45) Date of Patent: Dec. 6, 2016

(54) RADIO FREQUENCY COIL DEVICE AND MAGNETIC RESONANCE IMAGING SYSTEM

(71) Applicants: Wen Ming Li, Shenzhen (CN); Yu Ye Liu, Shenzhen (CN); Jian Min Wang, Shenzhen (CN)

(72) Inventors: Wen Ming Li, Shenzhen (CN); Yu Ye Liu, Shenzhen (CN); Jian Min Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 688 days.

(21) Appl. No.: 13/787,024

(22) Filed: Mar. 6, 2013

(65) Prior Publication Data

US 2013/0234714 A1  Sep. 12, 2013

(30) Foreign Application Priority Data

Mar. 6, 2012 (CN) .......................... 2012 1 0056453

(51) Int. Cl.
*G01R 33/34* (2006.01)
*G01R 33/36* (2006.01)
*G01R 33/3415* (2006.01)

(52) U.S. Cl.
CPC ..... *G01R 33/34092* (2013.01); *G01R 33/3664* (2013.01); *G01R 33/3415* (2013.01)

(58) Field of Classification Search
CPC .......... G01R 33/3415; G01R 33/3664; G01R 33/34092
See application file for complete search history.

(56) References Cited

U.S. PATENT DOCUMENTS

| | | | | | |
|---|---|---|---|---|---|
| 6,323,648 | B1 * | 11/2001 | Belt | ................... | G01R 33/3415 324/318 |
| 6,456,072 | B1 * | 9/2002 | Webb | ..................... | G01R 33/30 324/307 |
| 6,888,351 | B2 * | 5/2005 | Belt | ................... | G01R 33/3415 324/318 |
| 6,940,282 | B2 * | 9/2005 | Dumoulin | .......... | G01R 33/5612 324/318 |

(Continued)

FOREIGN PATENT DOCUMENTS

| | | |
|---|---|---|
| CN | 1864080 A | 11/2006 |
| CN | 101044979 A | 10/2007 |

(Continued)

OTHER PUBLICATIONS

Chinese Office Action for related Chinese application No. 201210056453.7, mailed Mar. 12, 2015.

*Primary Examiner* — Dixomara Vargas
(74) *Attorney, Agent, or Firm* — Lempia Summerfield Katz LLC

(57) ABSTRACT

An RF coil device and an MRI system are provided. The RF coil device includes m coil elements, where m is an integer greater than 1. The RF coil device also includes an RF switch control unit including n output terminals and m input terminals connected to the m coil elements, respectively, where n is an integer greater than or equal to 1 and less than m. The RF coil device includes a decoder for outputting a control signal to the RF switch control unit according to a received control command. The RF switch control unit connects each of not more than n input terminals to a different output terminal according to the control signal.

16 Claims, 6 Drawing Sheets

(56) References Cited

U.S. PATENT DOCUMENTS

| | | | |
|---|---|---|---|
| 7,026,818 B2* | 4/2006 | Machida | G01R 33/3415 324/309 |
| 7,030,614 B2* | 4/2006 | Matschl | G01R 33/3664 324/318 |
| 7,180,291 B2* | 2/2007 | Chmielewski | G01R 33/34046 324/318 |
| 7,221,160 B2* | 5/2007 | Leussler | G01R 33/3415 324/318 |
| 7,619,415 B2* | 11/2009 | Nakabayashi | G01R 33/34046 324/318 |
| 7,701,213 B2* | 4/2010 | Graesslin | G01R 33/3415 324/309 |
| 7,986,143 B2* | 7/2011 | Walsh | A61B 5/055 324/309 |
| 8,324,900 B2* | 12/2012 | Helvoort | H03F 3/189 324/307 |
| 8,406,852 B2* | 3/2013 | Weiss | G01R 33/287 324/318 |
| 8,451,004 B2* | 5/2013 | Walsh | A61B 5/055 324/309 |
| 8,698,500 B2* | 4/2014 | Vester | G01R 33/3415 324/318 |
| 8,773,131 B2* | 7/2014 | Mitsui | G01R 33/3415 324/318 |
| 8,866,476 B2* | 10/2014 | Fuderer | G01R 33/5611 324/307 |
| 8,994,375 B2* | 3/2015 | Albsmeier | G01R 33/3692 324/318 |
| 2005/0116715 A1 | 6/2005 | Vaughan et al. | |
| 2007/0229073 A1 | 10/2007 | Fujimoto et al. | |
| 2009/0076377 A1 | 3/2009 | Findekelee | |
| 2009/0174498 A1 | 7/2009 | Xing et al. | |
| 2010/0060283 A1 | 3/2010 | Findeklee et al. | |
| 2010/0060284 A1 | 3/2010 | Sugiura | |
| 2010/0271022 A1 | 10/2010 | Mitsui et al. | |
| 2011/0148418 A1 | 6/2011 | Findeklee | |

FOREIGN PATENT DOCUMENTS

| | | |
|---|---|---|
| CN | 101427150 A | 5/2009 |
| CN | 101454685 A | 6/2009 |
| CN | 101478067 A | 7/2009 |
| CN | 101669822 A | 3/2010 |
| CN | 101869478 A | 10/2010 |
| CN | 102158061 A | 8/2011 |

* cited by examiner

RADIO FREQUENCY COIL DEVICE AND MAGNETIC RESONANCE IMAGING SYSTEM

This application claims the benefit of CN 201210056453.7, filed on Mar. 6, 2012, which is hereby incorporated by reference.

TECHNICAL FIELD

The present embodiments relate to the technical field of magnetic resonance imaging (MRI).

BACKGROUND

With the rapid development of MRI technology, coil technology has also taken great strides forward (e.g., phased array coils with 8, 16 or even 32 channels). Coils may be divided into three types according to structure: linear coils, orthogonal coils, and phased array coils. A phased array coil includes multiple linear coils or orthogonal coils, each linear coil or orthogonal coil being a coil element. The phased array coil may receive RF pulses of the main magnetic field from multiple directions at the same time, while there are also multiple data acquisition channels matched thereto.

Referring to FIG. 1, an MRI system includes, for example, an RF coil device 101 and an imaging control device 102. The RF coil device 101 includes multiple coil sets, each coil set further including one or more coil elements 1011. Each coil element 1011 transmits input signals to a coax pin interface 1021 in the imaging control device 102 using RF channels RF(1)-RF(n). The coax pin interface 1021 transmits on/off commands from the imaging control device 102 to the coil elements 1011 using on/off control lines (Tune/Detune) TD(1)-TD(n), thereby controlling the opening/closing and on/off switching of the coil elements 1011. The number n of coil elements 1011 (e.g., the number of RF channels) may not exceed the number k of coax pins in the coax pin interface 1021.

SUMMARY AND DESCRIPTION

Since a greater number of RF channels results in a higher number of imaging pixels and better clarity, it is desirable to increase the number of RF channels without increasing the number of coax pins. The present embodiments may obviate one or more of the drawbacks or limitations in the related art. For example, an RF coil device that allows the number of RF channels to be greater than the number of coax pins, so as to increase the speed and signal-to-noise ratio of imaging (e.g., improve the imaging quality) is provided. As another example, an MRI system and control method allowing the number of RF channels to be greater than the number of coax pins, so as to increase the speed and signal-to-noise ratio of imaging (e.g., improve the imaging quality) are provided.

According to one aspect, an RF coil device including m coil elements, where m is an integer greater than 1, is provided. The RF coil device includes an RF switch control unit including n output terminals and m input terminals connected to the m coil elements, respectively, where n is an integer greater than or equal to 1 and less than m. The RF coil device also includes a decoder for outputting a control signal to the RF switch control unit according to a received control command. The RF switch control unit connects each of not more than n input terminals to a different output terminal according to the control signal.

The decoder may output control signals to the RF switch control unit according to received control signals, so that the RF switch control unit controls the making/breaking of connections between input RF channels and output RF channels, thereby enabling transmission of RF signals from the coil elements to the interface unit when the number of coil elements is greater than the number of coax pins in the interface unit. Thus, the number of coil elements may be increased in comparison to the solution presented in the background section, thereby increasing the speed and signal-to-noise ratio of imaging (e.g., improving the imaging quality).

Optionally, the decoder is connected to n on/off control lines and may receive control commands from the n on/off control lines. Since the decoder senses high/low states on the on/off control lines at the same time as the on/off control lines are controlling the on/off states of the coil elements, the decoder may send corresponding control signals to the RF switch control unit directly on the basis of received combination values of high/low states on the on/off control lines according to a preset correspondence relationship. The RF switch control unit thus controls the connection or disconnection of the corresponding RF channels. Thus, the decoder may obtain control signals in real time, and other commands are not sent again.

In one embodiment, the decoder is connected to fewer than n on/off control lines and may receive control commands from these on/off control lines.

In another embodiment, the control command includes a clock command and configuration data. The decoder may enter an active state or a sleep state according to a clock command received from one on/off control line, and may receive configuration data according to one or more other on/off control lines.

In one embodiment, the control command includes a clock command and configuration data. The decoder may enter an active state according to a clock command received from one on/off control line and enter a sleep state automatically after parsing the control command. The decoder may receive configuration data according to one or more other on/off control lines.

In this way, the decoder receives configuration data when in an active state, and does not receive configuration data when in a sleep state, so as to prevent on/off commands transmitted to coil elements by the on/off control lines causing incorrect configuration of the decoder.

In one embodiment, the RF switch control unit includes at least one multi-selector switch. Multiple input terminals of the multi-selector switch are each connected to a different one of the coil elements, an output terminal of the multi-selector switch serves as an output terminal of the RF switch control unit, and a control terminal of the multi-selector switch is connected to the decoder. Coil elements that are spaced apart may not be simultaneously energized during the magnetic resonance imaging process. One multi-selector switch may thus be used to control multiple coil elements. Thus, the RF switch control unit may accomplish the making/breaking of connections between input RF channels of multiple coil elements and one output RF channel using a multi-selector switch alone, and this structure is both simple and practical.

Optionally, any on/off control line is connected to one coil element or is connected to multiple coil elements that are consecutive in terms of position. Multiple coil elements energized during the magnetic resonance imaging process may be consecutive. One on/off control line may thus be connected to multiple coil elements, thereby reducing the number of on/off control lines.

According to another aspect, an MRI system is provided. The MRI system includes at least one of the above RF coil devices. The MRI system also includes an imaging control device including an interface unit and a control unit for sending through the interface unit the control commands and on/off commands for controlling the on/off switching of the coil elements. The MRI system also includes n on/off control lines connecting the interface unit with the coil elements, for transmitting the on/off commands sent by the control unit to the coil elements. All or some of the on/off control lines are also connected to the interface unit and the decoder, for transmitting control commands sent by the control unit to the decoder. The MRI system includes n RF channels connected to the output terminals of the RF switch control unit and to the interface unit.

The decoder may output control signals to the RF switch control unit according to instructions from the imaging control device, so that the RF switch control unit controls the making/breaking of connections between input RF channels and output RF channels, thereby enabling transmission of RF signals from the coil elements to the interface unit when the number of coil elements is greater than the number of coax pins in the interface unit. Thus the number of coil elements may be increased in comparison to the solution presented in the background, thereby increasing the speed and signal-to-noise ratio of imaging.

In one embodiment, when all of the on/off control lines are connected to the interface unit and the decoder, signals transmitted by all of the on/off control lines constitute a control command.

Since the decoder senses high/low states of the on/off control lines at the same time as the on/off control lines are controlling the on/off states of the coil elements, the decoder may send corresponding control signals to the RF switch control unit directly on the basis of received combination values of high/low states on the on/off control lines, according to a preset correspondence relationship. The RF switch control unit thus controls the connection or disconnection of the corresponding RF channels. Thus, the decoder may obtain corresponding control signals of the RF switch control unit in real time, and the imaging control device may not transmit commands for controlling the switching of states to the decoder again.

In one embodiment, the control unit may send a control command for activation to the decoder, so that the decoder enters an active state. The control unit stops processing received RF signals when sending the control command for activation.

In this way, when the decoder is in a sleep state, incorrect configuration of the decoder is unlikely to occur when the control unit sends on/off commands to the coil elements through the interface unit.

In another embodiment, the control command includes a clock command and configuration data. When some of the on/off control lines are connected to the interface unit and the decoder, one on/off control line is used to transmit a clock command to the decoder, so as to control the decoder to enter an active state or a sleep state. One or more other on/off control lines are used to transmit configuration data to the decoder.

Just some of the on/off control lines (e.g., just two on/off control lines) may be multiplexed. This is equivalent to using bus control.

DETAILED DESCRIPTION

Figure 1:
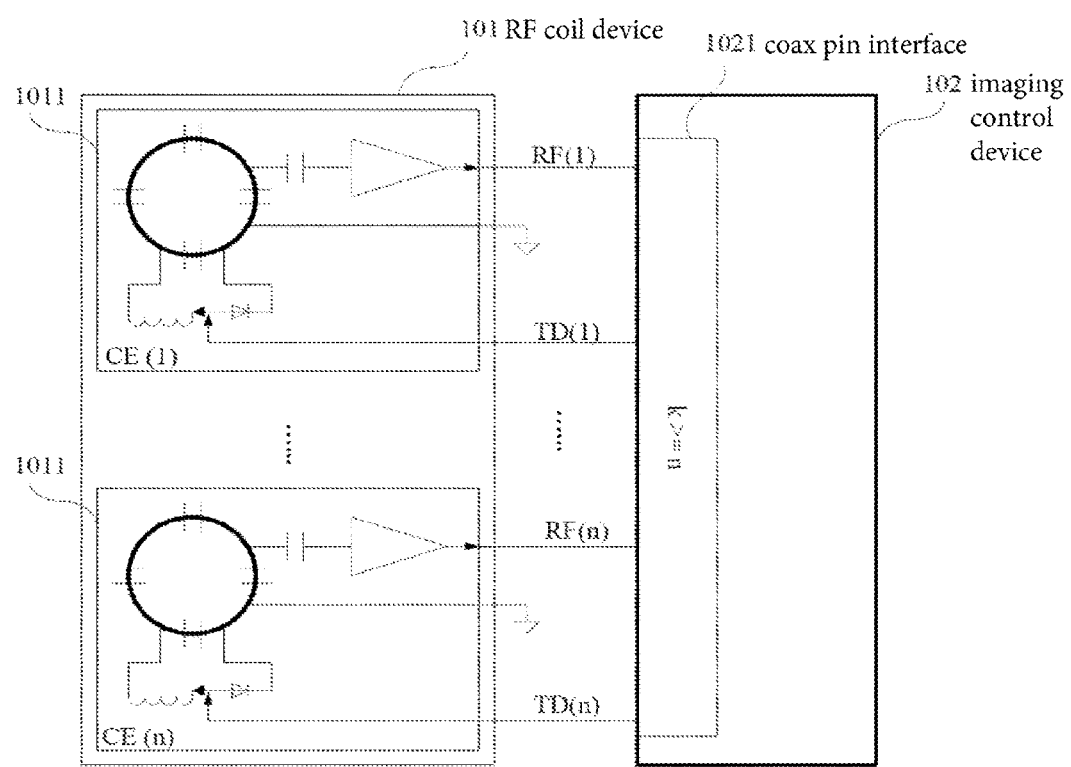
FIGS. 1 and 2 are structural diagrams of exemplary MRI systems.

Particular embodiments are explained below with reference to the accompanying drawings, in which the same labels indicate the same parts. In order to show the structures of the various components and the relationships therebetween clearly, the proportional relationships between the various components are no more than schematic in the drawings, and do not represent the proportional relationships in actual structures.

Figure 2:
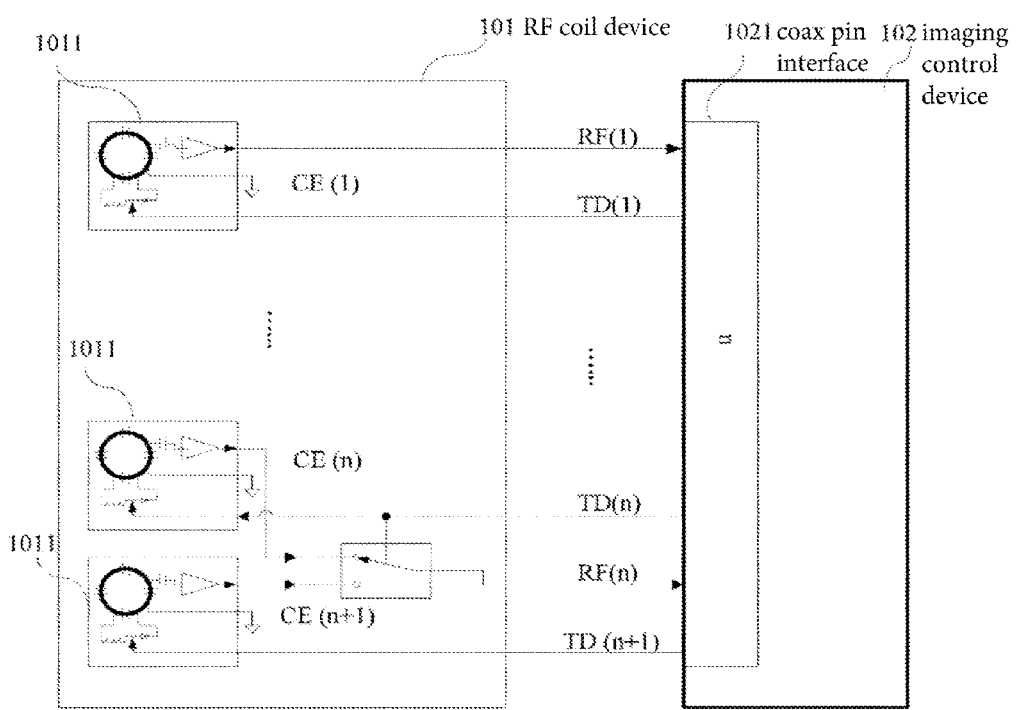

FIG. 2 shows one embodiment that includes multiple coil elements 1011 that multiplex a single RF channel, and accomplish switching among these multiple coil elements by a selection switch, so as to connect to the RF channel at different times. The number of on/off control lines is increased in the embodiment shown in FIG. 2. In an embodiment, the number of RF channels may be made greater than the number of coax pins without increasing the number of on/off control lines.

Figure 3:
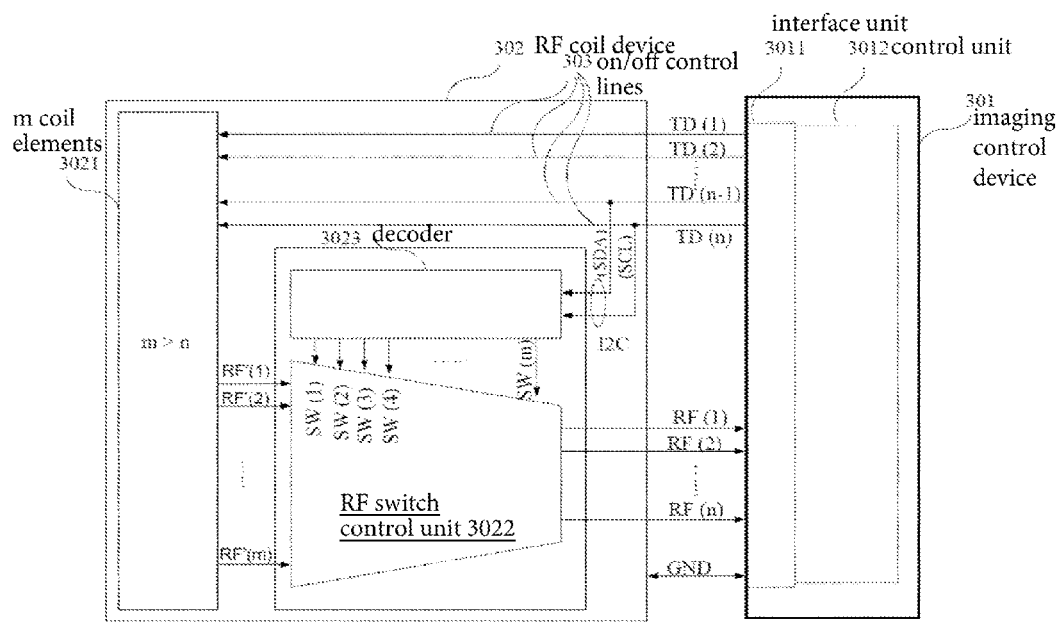
FIG. 3 is a structural diagram of one embodiment of an MRI system.

FIG. 3 shows an MRI system provided by this embodiment, including an imaging control device 301 and an RF coil device 302. The imaging control device 301 transmits on/off commands and control commands to the RF coil device 302 using on/off control lines 303 (also shown as TD(1)-TD(n) in the drawing, where n is an integer greater than or equal to 1), and the RF coil device 302 transmits RF signals to the imaging control device 301 using RF channels (also shown as RF(1)-RF(n) in the drawing). FIG. 3 also shows a ground line GND connected between the imaging control device 301 and the RF coil device 302.

The imaging control device 301 includes an interface unit 3011 and a control unit 3012. The interface unit 3011 includes n coax pins and n signal pins, each signal pin being connected to one on/off control line 303, where n is an integer greater than 1 (e.g., 8, 16 or 32). The control unit 3012 is used to receive RF signals via the coax pins, and to send on/off commands and control commands to the on/off control lines 303 via the signal pins.

The RF coil device 302 includes m coil elements 3021, an RF switch control unit 3022 and a decoder 3023. The RF switch control unit 3022 includes n output terminals (corresponding to n output RF channels RF(1)-RF(n)), and m input terminals (corresponding to m input RF channels RF'(1)-RF'(m)) connected to the m coil elements 3021, respectively, where m is an integer greater than 1, and n is an integer greater than 1 and less than m. The RF switch control unit 3022 is used to connect each of no more than n of the m input terminals to a different output terminal. The decoder 3023 may, for example, be a microcontroller (MCU) for receiving a control command sent by the imaging control device 301 via on/off control lines 303, and on the basis of this control command, outputting control signals to the RF switch control unit 3022. The state of connection/disconnection between the m input terminals in the RF switch control unit 3022 and the n output terminals may thus be controlled (e.g., control the RF switch control unit 3022 to connect each of no more than n of the m input terminals to a different output terminal).

The n on/off control lines 303 connect the interface unit 3011 to the coil elements 3021, for transmitting on/off commands sent by the interface unit 3011 to the coil elements 3021. All or some of the on/off control lines 303 connect the interface unit 3011 to the decoder 3023 (e.g., the decoder 3023 is connected to all or some of the on/off control lines 303) for transmitting control commands sent by the interface unit 3011 to the decoder 3023.

In this embodiment, the above function may be realized in the imaging control device 301 by adding a software control function. The decoder 3023 may send control signals to the RF switch control unit 3022 according to instructions from the imaging control device 301, so that the RF switch control device 3022 controls no more than n of the m input RF channels connected to the m coil elements 3021 to each connect to a different one of the output RF channels connected to the interface unit 3011. Transmission of RF signals from the coil elements 3021 to the interface unit 3011 is thus enabled even when the number of coil elements 3021 is greater than the number of coax pins in the interface unit 3011. Thus, the number of coil elements 3021 may be increased compared with the embodiment shown in FIG. 2, so as to increase the speed and signal-to-noise ratio of imaging.

According to one embodiment, when the control unit 3012 sends a control command for activation to the decoder 3023 through the interface unit 3011, the control command causes the decoder 3023 to enter an active state, and the control unit 3012 does not process RF signals sent by the coil elements 3021 and received by the interface unit 3011. In addition, when the control unit 3012 sends a control command for sleep to the coil elements 3021 through the interface unit 3011, the control command causes the decoder 3023 to enter a sleep state. Thus, when the decoder 3023 is in a sleep state, incorrect configuration of the decoder 3023 does not occur when the control unit 3012 sends on/off commands to the coil elements 3021 through the interface unit 3011.

In one embodiment, n is greater than 2, the control command includes a clock command and configuration data, and some of the on/off control lines 303 connect the interface unit 3011 to the decoder 3023. One of these on/off control lines 303 (further marked as SCL in the drawing to be easily identifiable) is used to transmit a clock command to the decoder 3023 as a control command for controlling activation and a control command for sleep, so as to control the decoder 3023 to enter an active state or a sleep state. One or more other on/off control lines 303 included in these on/off control lines 303 are used to transmit configuration data to the decoder 3023. In this embodiment, just some of the on/off control lines 303 (e.g., just two on/off control lines 303) may be multiplexed. This is equivalent to using bus control.

Figure 4:
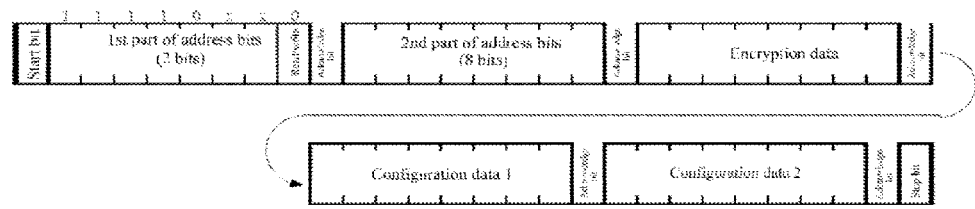
FIG. 4 is a schematic diagram of one embodiment of a control command.

For example, as FIG. 3 shows, one on/off control line SCL or 303 is multiplexed to transmit a clock command. Another on/off control line SDA or 303 is multiplexed to transmit configuration data. These two on/off control lines 303 are equivalent to an analog inter-integrated circuit (e.g., I2C; two-line serial bus) bus. The imaging control device 301 sends configuration data to the decoder 3023 via one on/off control line SCL or 303. At the same time, the imaging control device 301 sends a data signal to the decoder 3023 via the other on/off control line SDA or 303. FIG. 4 shows the structure of the control command. Two address commands that constitute a complete address are transmitted. In the first part of the address, "1110" represents the protocol used for the transmission and is an example of an applicable protocol, while "XX" represents two bits of the address content that, in combination with the eight bits of the second part of the address, give a total of ten bits, forming a complete address. With as many as ten bits, this address is appropriate to serve as a password for activating the decoder 3023. The configuration data in the control command is transmitted. In order to reduce the occurrence of incorrect configuration, one or more pieces of encryption data may be transmitted between the address commands and the configuration data, for the decoder 3023 to carry out checking.

The decoder 3023 parses the control command and, on the basis of the configuration data obtained by parsing and a preset correspondence relationship between configuration data and control signals for the RF switch control unit 3022, determines the corresponding control signal and sends the control signal to the RF switch control unit 3022. On the basis of the control signal received, the RF switch control unit 3022 controls the making/breaking of connections between the input terminals (e.g., equivalent to input RF channels) and output terminals (e.g., equivalent to output RF channels). Once parsing of the control command is complete, the decoder 3023 enters a sleep state automatically. The decoder 3023 continues sending the original control signal to the RF switch control unit 3022 until the decoder 3023 receives a new control command (e.g., including a control command for activation and configuration data). At the same time, the imaging control device 301 sends on/off commands to the coil elements 3021 via all the on/off control lines 303 in order to control the energizing or disconnection of the coil elements 3021. Energized coil elements 3021 send RF signals to the RF switch control unit 3022 via input RF channels, and the RF switch control unit 3022 connects each of these input RF channels to a different output RF channel according to the control signal in order to transfer the received RF signals to corresponding coax pins in the interface unit 3011.

Figure 5:
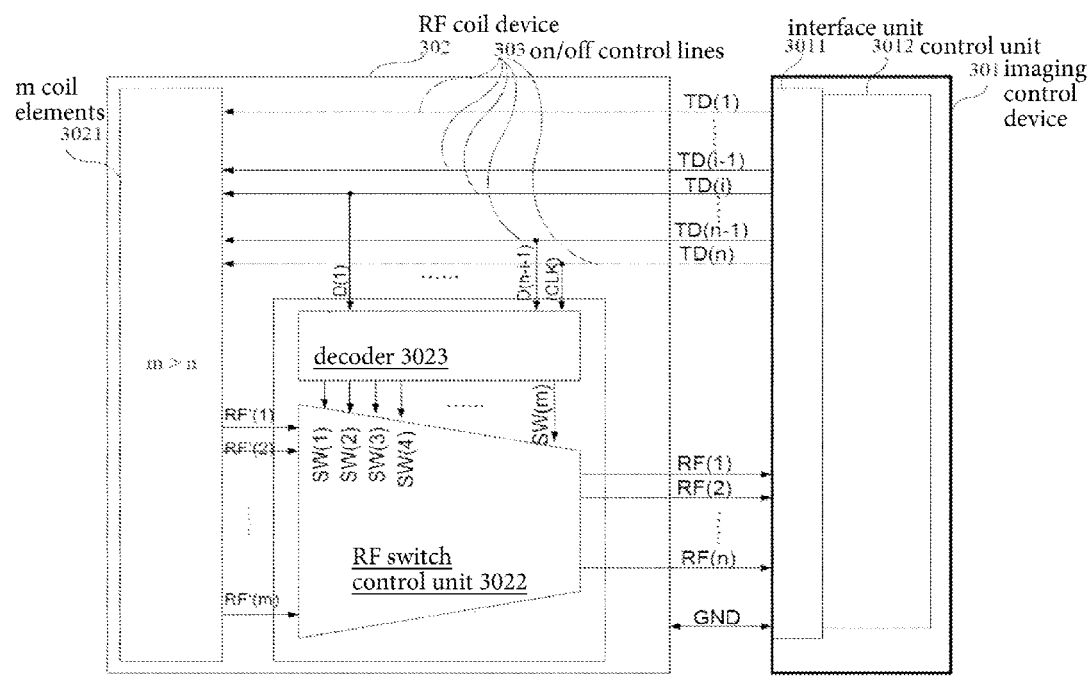
FIGS. 5 to 7 are structural diagrams of embodiments of MRI systems.

According to another embodiment, as shown in FIG. 5, one on/off control line (CLK) 303 is multiplexed to transmit clock commands. Multiple on/off control lines 303 (D(1)-D(n-i-1)) are multiplexed to transmit configuration data. When the imaging control device 301 sends a HIGH clock command (e.g., as a control command for activation) to the decoder 3023 via one on/off control line 303, the imaging control device 301 causes the decoder 3023 to enter an active state and read the high/low states of other on/off control lines connected to the decoder 3023 into an internal register, and to parse the high/low states to form a corresponding control signal to be outputted to the RF switch control unit 3022. When the imaging control device 301 sends a LOW clock command (e.g., as a control command for sleep) to the decoder 3023 via an on/off control line 303, the decoder 3023 enters a sleep state (e.g., a state in which the decoder 3023 does not receive from on/off control lines connected thereto). The decoder 3023 continues sending the original control signal to the RF switch control unit 3022 until the decoder 3023 receives new configuration data when next in an active state (e.g., receives a control command for activation). The imaging control device 301 also sends on/off signals to the coil elements 3021 via the on/off control lines 303 that are not used for clock commands, so as to control the energizing or disconnection of the coil elements 3021. Energized coil elements 3021 send RF signals to the RF switch control unit 3022 via input RF channels, and the RF switch control unit 3022 transfers the RF signals received to the interface unit 3011 via output RF channels.

Figure 6:
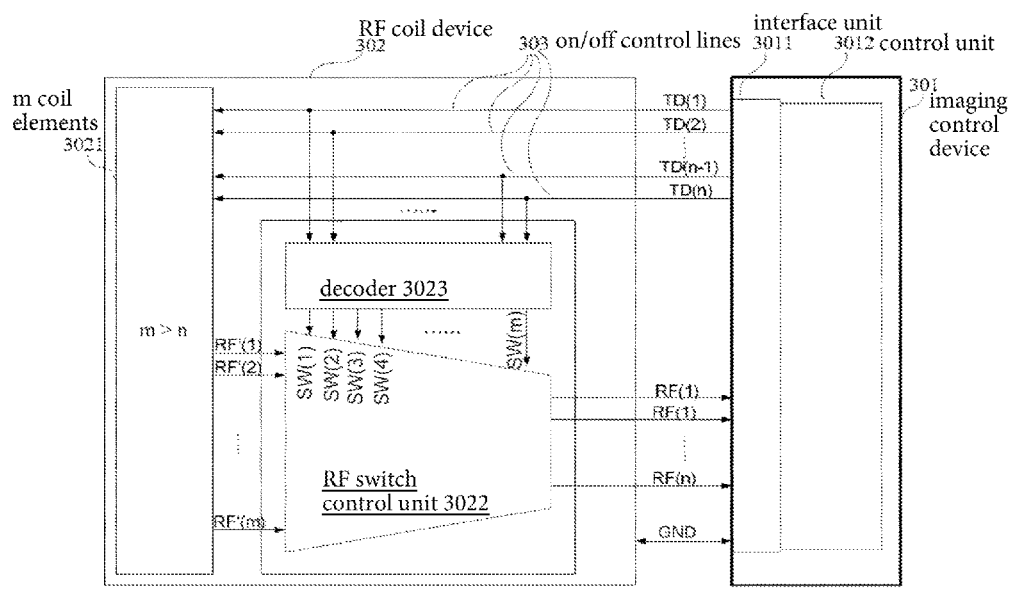

According to another embodiment, when all of the on/off control lines 303 connect the interface unit 3011 with the decoder 3023, combination values of high/low states of on/off control lines 303 are used by the decoder 3023 to generate corresponding control signals. Specifically, as FIG. 6 shows, all of the on/off control lines 303 are multiplexed to transmit control commands. The imaging control device 301 sends on/off commands to the coil elements 3021 via all of the on/off control lines 303, so as to control the energizing or disconnection of the coil elements 3021. At the same time, the decoder 3023 is also sensing high/low states on the on/off control lines in real time. The decoder 3023 parses received combination values of high/low states to form corresponding control signals for the RF switch control unit 3022, and sends the control signals to the RF switch control unit 3022 in real time. This way of control is equivalent to having a signal transmitted on one on/off control line 303 correspond to one bit, with the whole combined signal transmitted by all the on/off control lines 303 constituting configuration data. This may shorten the duration of transmission of configuration data compared with serial data transmission. Energized coil elements 3021 send RF signals to the RF switch control unit 3022 via input RF channels, and the RF switch control unit 3022 transfers the RF signals received to the interface unit 3011 via output RF channels.

Figure 7:
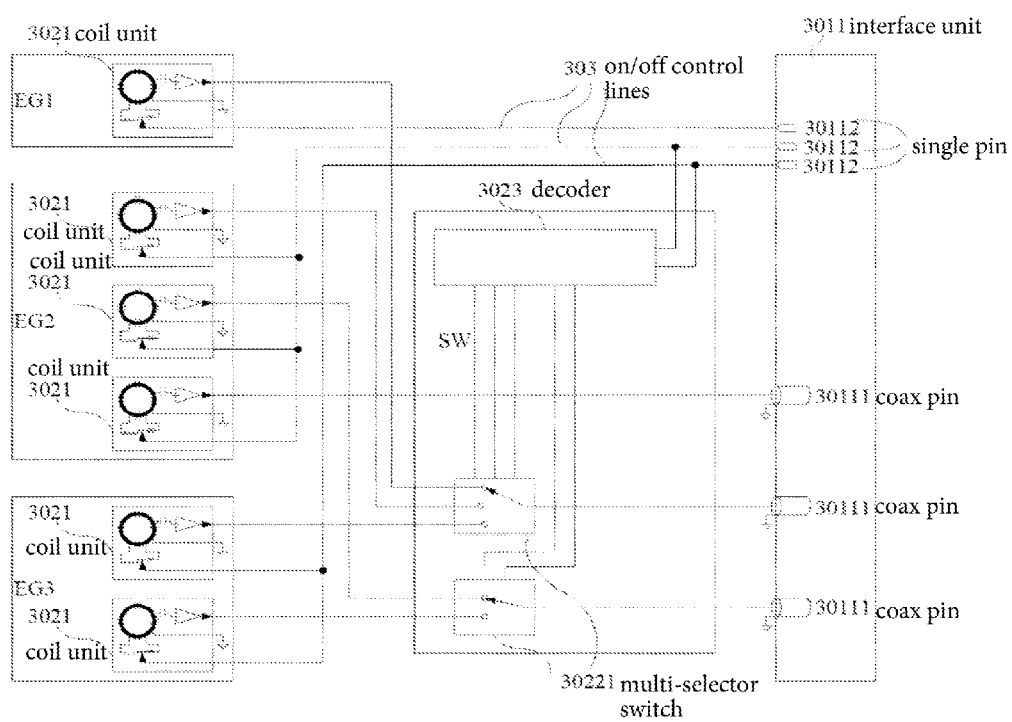

According to one embodiment, the RF switch control unit 3022 includes a multi-selector switch 30221. Multiple input terminals of the multi-selector switch 30221 are each connected to a different coil element 3021, and the multiple coil elements 3021 connected to the multi-selector switch 30221 may all be non-consecutive in terms of position. An output terminal of the multi-selector switch 30221 is connected to the interface unit 3011, and a control terminal of the multi-selector switch 30221 may be connected to the decoder 3023 via a signal line SW. Referring to FIG. 7, m coil elements 3021 belong to multiple coil sets. Multiple coil elements 3021 connected to one multi-selector switch 30221 belong to different coil sets. Coil elements 3021 that are spaced apart may not be simultaneously energized during the magnetic resonance imaging process. Thus, one multi-selector switch 30221 may be used to control multiple coil elements 3021. The RF switch control unit 3022 may thus accomplish the making/breaking of connections between input RF channels of multiple coil elements 3021 and the output RF channel to one coax pin using a multi-selector switch 30221 alone. This structure is both simple and practical. The decoder 3023 is connected to the control terminal of the multi-selector switch 30221, and by controlling the HIGH/LOW signal (e.g., control signal) outputted by the decoder 3023 to the control terminal of the multi-selector switch 30221, the connection of one of the multiple input terminals of the multi-selector switch 30221 to the output terminal of the multi-selector switch 30221 may be controlled. The maximum number of signal lines from the decoder 3023 to the RF switch control unit 3022 is m, as is the case in FIGS. 3 to 5 with SW(1)-SW(m). There may, however, be less than m signal lines, depending on the number of coil sets and the number of coil elements 3021 included in each coil set.

According to an embodiment, the on/off control lines 303 are connected to multiple coil elements 3021, and multiple coil elements 3021 connected to one on/off control line 303 are consecutive in terms of position. Referring to FIG. 7, m (e.g., m=6) coil elements 3021 belong to multiple coil sets EG1-EG3. Multiple coil elements 3021 connected to one on/off control line 303 belong to the same coil set (e.g., EG2 or EG3). Multiple coil elements 3021 energized during the magnetic resonance imaging process may be consecutive. Thus, one on/off control line 303 may be connected to multiple coil elements 3021, thereby reducing the number of on/off control lines 303.

An RF coil device and an MRI system enabling the number of RF channels to be greater than the number of coax pins, so as to increase the speed and signal-to-noise ratio of imaging are provided. The RF coil device includes m coil elements, where m is an integer greater than 1. The RF coil device also includes an RF switch control unit including n output terminals and m input terminals connected to the m coil elements, respectively, where n is an integer greater than or equal to 1 and less than m. The RF coil device also includes a decoder for outputting a control signal to the RF switch control unit according to a received control command. The RF switch control unit connects each of not more than n input terminals to a different output terminal according to the control signal.

The present invention has been illustrated and explained in detail above using accompanying drawings and embodiments, but is not limited to these disclosed embodiments. Other solutions deduced therefrom by those skilled in the art also fall within the scope of protection of the present invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A radio frequency coil device connected to an interface unit having n coax pins and n signal pins, the radio frequency coil device comprising:
   m coil elements, wherein m is an integer greater than 1;
   a RF switch control unit comprising n output terminals and m input terminals connected to the m coil elements, respectively, wherein n is an integer greater than or equal to 1 and less than m;
   n or fewer on/off control lines connecting signal pins of the interface unit to a decoder; and
   the decoder, integrated into the radio frequency coil device, operable to output a switch control signal to the RF switch control unit according to control commands received via the n or fewer on/off control lines,
   wherein the decoder controls the RF switch control unit to connect each n or less input terminals to a different output terminal according to the switch control signal.

2. The radio frequency coil device as claimed in claim 1, wherein the control commands received via the n or fewer on/off control lines comprise a clock command and configuration data, and wherein the decoder is operable to:
   enter an active state or a sleep state according to the clock command received from one of the on/off control lines; and
   receive the configuration data according to one or more other on/off control lines of the on/off control lines.

3. The radio frequency coil device as claimed in claim 1, wherein the control commands received via the n or fewer on/off control lines comprise a clock command and configuration data; and wherein the decoder is operable to:
   enter an active state according to the clock command received from one of the on/off control lines;
   enter a sleep state automatically after parsing the control command; and
   receive the configuration data according to one or more other on/off control lines of the on/off control lines.

4. The radio frequency coil device as claimed in claim 1, wherein the RF switch control unit comprises at least one multi-selector switch, wherein a plurality of input terminals of the multi-selector switch are each connected to a different one of the coil elements, wherein an output terminal of the multi-selector switch serves as an output terminal of the RF switch control unit, and wherein a control terminal of the multi-selector switch is connected to the decoder.

5. The radio frequency coil device as claimed in claim 1, wherein any of the on/off control lines is connected to one of the coil elements, or wherein any of the on/off control lines is connected to a plurality of the coil elements that are consecutive in terms of position.

6. The radio frequency coil device as claimed in claim 1, wherein the control signal output from the decoder senses high/low states on the on/off control lines at a same time as the on/off control lines are controlling the on/off states of the received combination values.

7. The radio frequency coil device as claimed in claim 6, wherein the control signal output is obtained in real time.

8. A magnetic resonance imaging system comprising:
at least one radio frequency coil device comprising:
m coil elements, wherein m is an integer greater than 1;
a RF switch control unit comprising n output terminals and m input terminals connected to the m coil elements, respectively, wherein n is an integer greater than or equal to 1 and less than m; and
a decoder, integrated into the at least one radio frequency coil device, operable to output a switch control signal to the RF switch control unit according to control commands received via n on/off control lines connecting signal pins of an interface unit to the decoder, wherein the decoder controls the RF switch control unit to connect each n or less input terminals to a different output terminal according to the switch control signal; and
an imaging control device comprising:
the interface unit having n coax pins;
a control unit operable to send, through the interface unit, the control commands and on/off commands for controlling on/off switching of the coil elements;
the n on/off control lines further connecting the interface unit with the coil elements,
wherein the connection of the interface unit with the coil elements is operable for transmitting the on/off commands sent by the control unit to the coil elements; and
n RF channels connected to the output terminals of the RF switch control unit and to the interface unit.

9. The magnetic resonance imaging system as claimed in claim 8, wherein signals transmitted by all of the on/off control lines constitute one or more control commands when all of the on/off control lines are connected to the interface unit and the decoder.

10. The magnetic resonance imaging system as claimed in claim 9, wherein the control signal output from the decoder senses high/low states on the on/off control lines at a same time as the on/off control lines are controlling the on/off states of the received combination values.

11. The magnetic resonance imaging system as claimed in claim 8, wherein the control unit is operable to send a control command for activation to the decoder so that the decoder enters an active state, and
wherein the control unit is operable to stop processing received RF signals when sending the control command for activation.

12. The magnetic resonance imaging system as claimed in claim 11, wherein the control command comprises a clock command and configuration data, and
wherein, when some of the on/off control lines are connected to the interface unit and the decoder, one of the on/off control lines is operable to transmit the clock command to the decoder so as to control the decoder to enter the active state, a sleep state, or the active state and the sleep state, and one or more other on/off control lines of the on/off control lines are operable to transmit the configuration data to the decoder.

13. The magnetic resonance imaging system as claimed in claim 8, wherein a control command of the control commands comprises a clock command and configuration data, and wherein the decoder is operable to:
enter an active state or a sleep state according to the clock command received from one of the on/off control lines;
receive the configuration data according to one or more other on/off control lines of the on/off control lines.

14. The magnetic resonance imaging system as claimed in claim 8, wherein a control command of the control commands comprises a clock command and configuration data; and the decoder is operable to:
enter an active state according to the clock command received from one of the on/off control lines;
enter a sleep state automatically after parsing the control command; and
receive the configuration data according to one or more other on/off control lines of the on/off control lines.

15. The magnetic resonance imaging system as claimed in claim 8, wherein the RF switch control unit comprises at least one multi-selector switch, wherein a plurality of input terminals of the multi-selector switch are each connected to a different one of the coil elements, wherein an output terminal of the multi-selector switch serves as an output terminal of the RF switch control unit, and wherein a control terminal of the multi-selector switch is connected to the decoder.

16. The magnetic resonance imaging system as claimed in claim 8, wherein any of the on/off control lines is connected to one of the coil elements, or wherein any of the on/off control lines is connected to a plurality of the coil elements that are consecutive in terms of position.

* * * * *

UNITED STATES PATENT AND TRADEMARK OFFICE
CERTIFICATE OF CORRECTION

| | | |
|---|---|---|
| PATENT NO. | : 9,513,350 B2 | Page 1 of 1 |
| APPLICATION NO. | : 13/787024 | |
| DATED | : December 6, 2016 | |
| INVENTOR(S) | : Wen Ming Li et al. | |

It is certified that error appears in the above-identified patent and that said Letters Patent is hereby corrected as shown below:

In the Claims
    Column 10
    Claim 13, --and-- should be inserted at the end of Line 27

Signed and Sealed this
Seventh Day of February, 2017

Michelle K. Lee
*Director of the United States Patent and Trademark Office*